United States Patent [19]

Fukaya et al.

[11] Patent Number: 4,596,957
[45] Date of Patent: Jun. 24, 1986

[54] AMPLIFIER SYSTEM SWITCHABLE BETWEEN TWO AMPLIFYING OPERATIONS

[75] Inventors: Hirokazu Fukaya; Haruo Niki, both of Tokyo, Japan

[73] Assignee: Nippon Electric Company Limited, Tokyo, Japan

[21] Appl. No.: 639,296

[22] Filed: Aug. 10, 1984

Related U.S. Application Data

[62] Division of Ser. No. 446,131, Dec. 2, 1982.

[30] Foreign Application Priority Data

Dec. 2, 1981 [JP] Japan ................................ 56-194151
Mar. 8, 1982 [JP] Japan ................................ 57-36140

[51] Int. Cl.[4] .......................... H03F 3/45; H03F 3/68
[52] U.S. Cl. ................................ 330/252; 330/124 R
[58] Field of Search ........... 330/149, 151, 296, 124 R, 330/295, 252, 51

[56] References Cited

U.S. PATENT DOCUMENTS 4,217,554 8/1980 Brzozowski .................. 330/151

Primary Examiner—James B. Mullins
Assistant Examiner—G. Wan
Attorney, Agent, or Firm—Sughrue, Mion, Zinn, Macpeak, and Seas

[57] ABSTRACT

An amplifier switchable between a dual-channel amplifier and a BTL amplifier includes first and second amplifying circuits having a non-inverting input, an inverting input and an output, a first input terminal receiving a first input signal and applying it to the non-inverting input of the first amplifying circuit, a second input terminal receiving a second input signal, a first switch selectively applying a signal to the non-inverting input of the first or second amplifying circuit, a second switch controlling the application of an output from the first amplifying circuit to the inverting input of the second amplifying circuit, a controlling circuit controlling the first and second switches, first through third loads and a third switch controlling the application of an output from the first and second amplifying circuits to the first and second loads, respectively, or to the respective ends of the third load.

4 Claims, 5 Drawing Figures

AMPLIFIER SYSTEM SWITCHABLE BETWEEN TWO AMPLIFYING OPERATIONS

This a division of application Ser. No. 446,131, filed Dec. 2, 1982.

BACKGROUND OF THE INVENTION

This invention relates to an amplifier system, and more particularly, to a system which is switchable between two amplifying operations.

Audio signal power amplifiers can be classified into a single-channel amplifier and a dual-channel amplifier. The single-channel amplifier amplifies a monaural signal, and the dual-channel amplifier is used to amplify a stereophonic signal.

Examples of these amplifiers are shown in FIGS. 1 and 2 in block diagrams. FIG. 1 is a conventional dual-channel amplifier and FIG. 2 is a BTL type single-channel amplifier which uses two amplifiers to produce a large output.

Referring to FIG. 1, a main part 100 of the single-channel amplifier is formed in a semiconductor integrated circuit which includes two feedback amplifiers 200 and 300 and two feedback resistors $R_{f3}$ and $R_{f4}$. Each of the feedback amplifiers 200 and 300 has an inverting input (−) and a non-inverting input (+). These amplifiers 200 and 300 are energized by a power supply source Vcc. A first input signal $V_{S1}$ is applied to the non-inverting input (+) of the amplifier 200. A series connection of a resistor $R_{f1}$ and a capacitor C1 is connected between the inverting input (−) of the amplifier 200 and ground to form a feedback circuit together with the feedback resistor $R_{f3}$. An output terminal of the amplifier 200 is connected to a first load $R_{L1}$ through a capacitor $C_3$. Similarly, a second input signal $V_{S2}$, a resistor $R_{f2}$, capacitors $C_2$ and $C_4$ and a second load $R_{L2}$ are connected to the amplifier 300.

The amplifiers 200 and 300 amplify respectively, the first and second input signals $V_{S1}$ and $V_{S2}$ and their amplification functions are independent of each other. This arrangement is preferable for amplifying a stereophonic signal.

Another type of amplifier is shown in FIG. 2 and is a BTL amplifier having a feature that a large voltage output can be obtained. In more detail, a main part 100 has a circuit configuration similar to the main part 100 of FIG. 1 with the difference residing in the circuit configuration outside the main part 100. An input signal $V_{S3}$ is introduced to the non-inverting input (+) of the amplifier 200 and the resistors $R_{f1}$ and $R_{f3}$ and the capacitor $C_1$ are connected to the amplifier 200 to form a feedback amplifier similar to FIG. 1. The output of the amplifier 200 is connected to one end of a load $R_{L3}$ and to one end of a resistor $R_{a5}$. A signal attenuated by a voltage divider composed of the resistor $R_{a5}$ and a resistor $R_{f2}$ is applied to the inverting input (−) of the amplifier 300 through a capacitor $C_2$. The non-inverting input (+) of the amplifier 300 is grounded through a capacitor $C_5$. A resistor $R_{f4}$ is provided to operate the amplifier 300 as a feedback amplifier. An output of the amplifier 300 is connected to the other end of the load $R_{L3}$.

With the BTL amplifier of FIG. 2, the output applied to one end of the load $R_{L3}$ through the amplifier 200 has a reverse phase to that applied to the other end of the load $R_{L3}$ through the amplifier 300. Therefore, the output obtained at the load $R_{L3}$ is twice the output at the loads $R_{L1}$ and $R_{L2}$. This amplifier is preferable for producing a large output.

Referring to FIGS. 1 and 2, both amplifiers use the same main part 100. Thus, by changing the circuit outside the main part 100, it is possible to change the amplifier of FIG. 1 to the amplifier of FIG. 2 and vice versa. However, it is difficult in fact to assemble the amplifier so as to be switchable between either configuration. Further, there has been proposed no integrated circuit integrating two amplifiers with a switching circuit for changing the amplifier function. Because of this fact, a switchable amplifier using a conventional integrated circuit requires a number of circuit elements to be combined with the integrated circuit.

SUMMARY OF THE INVENTION

It is an object of the present invention to provide an amplifier switchable between a dual-channel amplifier and a BTL amplifier.

It is another object of the present invention to provide a switchable amplifier suitable for an integrated circuit.

According to the present invention, a switchable amplifier includes a first and a second amplifying circuit each having an inverting input and a non-inverting input and an output, a first input terminal connected to the non-inverting input of the first amplifying circuit, a second input terminal, a first output terminal receiving an output from the first amplifying circuit, a second output terminal receiving an output from the second amplifying circuit, a first switch coupled between the second input terminal and the non-inverting input of the second amplifying circuit, a second switch coupled between the first and second input terminals, a third switch coupled between the first output terminal and the inverting input of the second amplifying circuit and a control circuit controlling the ON-OFF conditions of the first, second and third switches, the ON-OFF condition of the first switch being kept opposite to the ON-OFF conditions of the second and third switches.

The switchable amplifier of the present invention can be changed by the control circuit from a dual-channel amplifier to a BTL amplifier and vice versa, and the circuit configuration for changing its function is simple. Further, the first, second and third switches and the main part of the control circuit can be built on a semiconductor chip together with the first and second amplifying circuits. This fact decreases significantly the number of circuit elements which must be attached outside the integrated circuit.

DETAILED DESCRIPTION OF THE INVENTION

Figure 1:
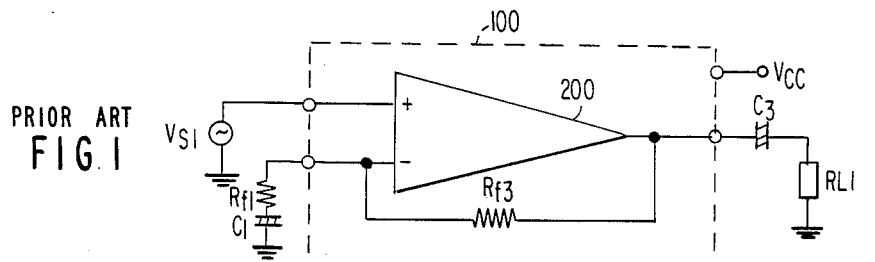
FIG. 1 is a block diagram of a conventional dual-channel amplifier.
Figure 2:
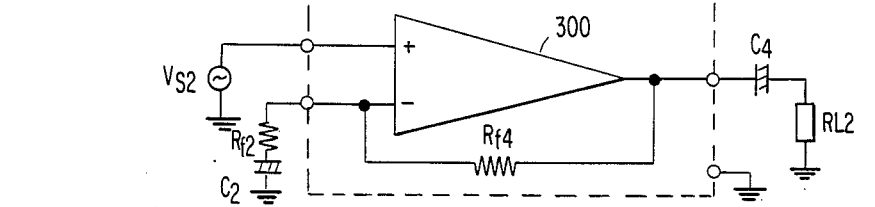
FIG. 2 is a block diagram of a conventional BTL amplifier.
Figure 3:
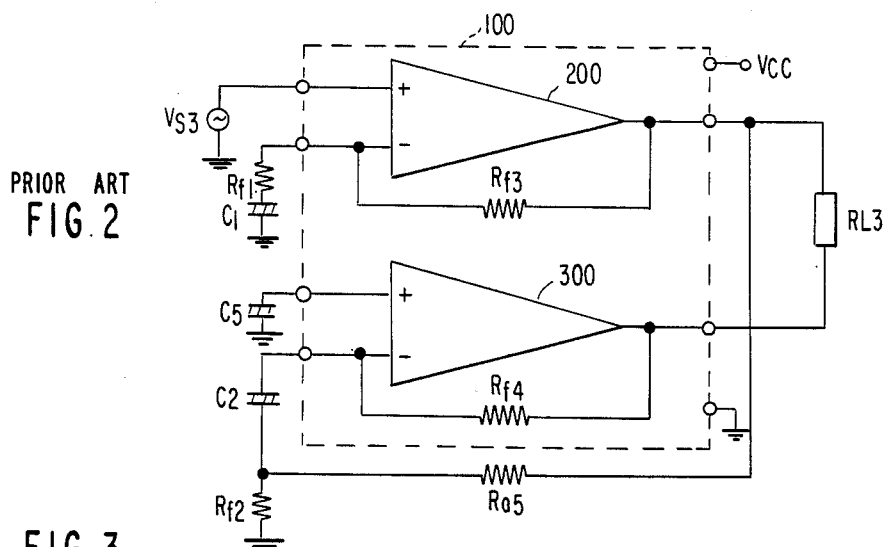
FIG. 3 is a block diagram of a preferred embodiment of the present invention.

The preferred embodiment of the present invention is shown in the block diagram of FIG. 3 in which the circuit elements identical to those in FIGS. 1 and 2 are shown by the same reference numbers and characters as in FIGS. 1 and 2. The main part 100 encircled with a dotted line is preferably formed in a semiconductor integrated circuit. The integrated circuit (100) is constructed of the negative feedback power amplifying circuits 200 and 300, a switch control circuit 400 and switches SW1, SW2 and SW3. Moreover, the integrated circuit 100 is equipped with signal input terminals a and c, feedback terminals b and d, output terminals f and g, a BTL feedback terminal i, a switching control terminal j, a power supply terminal h and a grounding terminal e. Moreover, external switches SWa, SWb, and SWc are made coactive. It should be noted that the feedback resistors $R_{f3}$, $R_{f4}$ and the resistor $R_{a5}$ can be arranged to be outside the integrated circuit (100).

Now, if the switch SWa is assumed to be in the position shown in FIG. 3, the switching control terminal j is in its open state so that the switch SW1 is in its ON, or closed state whereas the switches SW2 and SW3 are in their OFF, or open states. Thus, the signal input terminals a and c are respectively connected to the non-inverting inputs of the negative feedback power amplifying circuits 200 and 300. Moreover, the output terminals g and f are respectively connected through the switches SWb and SWc to the coupling capacitors $C_3$ and $C_4$. At this time, the input signal $V_{S1}$ applied to the signal input terminal a is amplified by the negative feedback power amplifying circuit 300 and an output obtained at the output terminal f is fed to the load resistor $R_{L2}$ through the switch SWc and the capacitor $C_4$. Thus, the integrated circuit (100) functions as a dual-channel amplifier.

On the contrary, when the switching control terminal j is grounded by the switch SWa, the switches SW2 and SW3 are rendered ON whereas the switch SW1 is rendered OFF. At this time, the non-inverting input of the negative feedback power amplifying circuit 200 receives input signals from the signal input terminal a and from the signal input terminal c through the switch SW2. The non-inverting input of the negative feedback power amplifying circuit 300 is disconnected from the signal input terminal c by the OFF state of the switch SW1. It is noted that, if the non-inverting input of the negative feedback power amplifying circuit 300 is not internally biased, the non-inverting input should be grounded to the reference potential by a modification of the switch SW1. Moreover, the output terminal g of the negative feedback power amplifying circuit 200 is connected to the inverting input of the negative feedback power amplifying circuit 300 through the resistor $R_{a5}$, the switch SW3, the BTL feedback terminal i, the capacitor $C_2$ and the feedback terminal d. The output terminals g and f are connected through the switches SWb and SWc to the load resistor $R_{L3}$, so that they are disconnected from the coupling capacitors $C_3$ and $C_4$. With this circuit arrangement, the input signal $V_{S1}$ applied to the signal input terminal a, and the input signal $V_{S2}$ applied to the signal input terminal are mixed through the switch SW2, and the mixed signal is transmitted to the non-inverting input of the negative feedback power amplifying circuit 200 to be amplified. The signal amplified by the negative feedback power amplifying circuit 200 is fed to one end of the load resistor $R_{L3}$ from the output terminal g. Further, the signal obtained at the output terminal g is applied to the BTL feedback terminal i through the resistor $R_{a5}$ and the switch SW3, to be attenuated by the resistors $R_{a5}$ and $R_{f2}$ to the same amplification as the original input signal $V_{S1}$. The attenuated signal is applied to the inverting input of the negative feedback power amplifying circuit 300 through the capacitor $C_2$ and the feedback terminal d. The amplifying circuit 300 produces an inverted output at the output terminal f and applies it to the other end of the load resistor $R_{L3}$. Thus, the integrated circuit (100) functions as a BTL amplifier.

According to the present invention, an amplifier switchable between a dual-channel amplifier and a BTL amplifier is obtained with a simple structure. Only three switches are needed for switching the amplifier function.

Furthermore, the switches SW1, SW2 and SW3 and switch control circuit 400 are easily formed in a semiconductor integrated circuit (100) together with feedback power amplifying circuits 200 and 300. This significantly decreases the number of external circuit elements.

An example of a circuit design using the integrated circuit 100 will be explained hereinafter by referring to FIG. 4. The input signal $V_{S1}$ is applied to the non-inverting input of the amplifying circuit 200 by way of the input terminal a, a transistor $Q_1$, a resistor $R_2$, a transistor $Q_3$ and a transistor $Q_9$. Transistors $Q_2$, $Q_{13}$, $Q_{14}$, $Q_{15}$, a diode $D_2$ and their associated resistors $R_{11}$, $R_{15}$ are used for performing a stable biasing of the circuit. Transistors $Q_4$, $Q_5$ and $Q_6$ and resistors $R_4$ and $R_5$ are arranged to mix the input signal $V_{S2}$ and to stabilize the biasing current of diode $D_1$ and the transistor $Q_9$. The mixture is controlled by a switch transistor $Q_7$ which corresponds to the switch SW2 in FIG. 3. The stabilization of the biasing current is achieved together with the operation of the circuit constructed of transistors $Q_8$, $Q_{10}$ and $Q_{16}$ and resistors $R_7$, $R_8$ and $R_{16}$ which is controlled by the transistor $Q_{11}$ operated in opposite phase to the transistor $Q_7$.

Similarly, the input signal $V_{S2}$ is applied to the non-inverting input of the amplifying circuit 300 by way of a transistor $Q_{17}$, a resistor $R_{18}$, a transistor $Q_{20}$ and a transistor $Q_{28}$, when the system is operating as a dual-channel amplifier. At this time, a switch transistor $Q_{19}$ which corresponds to the switch SW1 in FIG. 3 is non-conducting conducting to allow the input signal $V_{S2}$ to be applied to the amplifying circuit 300. This non-conducting state of transistor $Q_{19}$ thus corresponds to the ON position of switch SW2. Transistors $Q_{18}$, $Q_{29}$ and $Q_{30}$ and their associated resistors $R_{26}$ and $R_{27}$ perform a stable biasing of the circuit. Transistors $Q_{21}$, $Q_{22}$, $Q_{23}$ and $Q_{24}$ and resistors $R_{21}$, $R_{22}$, $R_{32}$ and $R_{33}$ control the current flowing through a diode $D_3$. The current flowing through the diode $D_3$ is also adjusted by the circuit constructed of transistors $Q_{25}$, $Q_{26}$ and $Q_{27}$ and resistors $R_{24}$, $R_{25}$ and $R_{34}$. The switch transistors $Q_{11}$ and $Q_{19}$ are controlled by a switch transistor $Q_{12}$ which corresponds to the switch control circuit 400 of FIG. 3.

Transistors $Q_{31}$ and $Q_{32}$ and their associated resistors $R_{28}$, $R_{29}$ and $R_{a5}$ operate as the switch SW3 in FIG. 3. When the switch SWa is turned to the BTL side, the transistor $Q_{32}$ turns on to apply the output from the amplifying circuit 200 to the inverting input of the amplifying circuit 300 after the output is attenuated by the resistors $R_{a5}$ and $R_{f2}$. The attenuation factor is adjusted to have the same value as the amplification factor of the amplifying circuit 200.

Next, the operation of the circuit will be described. First of all, the switches SWa, SWb and SWc are assumed to be in their Dual position. The transistors $Q_7$, $Q_{12}$, $Q_{24}$ and $Q_{31}$ are in their conducting states whereas the transistors $Q_{11}$ and $Q_{19}$ are in their non-conducting states, so that the transistors $Q_4$ and $Q_6$ are rendered non-conducting whereas transistors $Q_{17}$ and $Q_{20}$ are rendered conducting. The input signal $V_{S1}$ is transmitted through the transistors $Q_1$ and $Q_3$ to the current mirror circuit consisting of the diode $D_1$ and the transistor $Q_9$ and further to the amplifying circuit 200. After the input signal $V_{S1}$ is amplified by the amplifying circuit 200, it is fed from the output terminal q to the load $R_{L1}$. In a like manner, the input signal $V_{S2}$ is transmitted to the current mirror circuit of the diode $D_3$ and the transistor $Q_{28}$ through the transistor $Q_{17}$ and the resistor $R_{18}$ and further to the amplifying circuit 300. After the input signal $V_{S2}$ is amplified by the amplifying circuit 300, it is fed from the output terminal f to the load $R_{L2}$. Thus, the integrated circuit 100 acts as a dual-channel amplifier.

When the switches SWa, SWb and SWc are in their BTL positions, however, the switching control terminal c is grounded, so that the transistors $Q_7$, $Q_{12}$, $Q_{24}$ and $Q_{31}$ are rendered non-conducting whereas the transistors $Q_{11}$ and $Q_{19}$ are rendered conducting. Therefore, the transistors $Q_4$, $Q_6$ and $Q_{32}$ are conducting whereas the transistors $Q_{17}$ and $Q_{20}$ are non-conducting. The input signal $V_{S1}$ is transmitted to the diode $D_1$ in a similar manner to the aforementioned dual-channel operation. On the other hand, the input signal $V_{S2}$ is also transmitted to the diode $D_1$ through the transistors $Q_6$ and $Q_4$ so that it is mixed with the input signal $V_{S1}$. The mixed signal is amplified by the amplifying circuit 200.

The output from the amplifying circuit 200 is delivered to the load $R_{L13}$ through the output terminal g and the switch SWb and also to the inverting input of the amplifying circuit 300 through the resistor $R_{a5}$, the transistor $Q_{32}$, the BTL feedback terminal i, the capacitor $C_2$ and the feedback terminal d. The signal to be applied to the amplifying circuit 300 has its voltage attenuated by the resistors $R_{a5}$ and $R_{f2}$ to a value equal to the signal voltage at the non-inverting input of the amplifying circuit 200. The input signal thus transmitted is amplified by the amplifying circuit 300 which generates an inverted output from the output terminal j. As a result, the load $R_{L3}$ receives at both terminals the respective output signals having their phases inverted. Thus, the integrated circuit 100 acts as a BTL amplifier. It should be noted that, if the mixing function of the input signal $V_{S2}$ with the input signal $V_{S1}$ is not desired, the input signal $V_{S1}$ may be cut off by arranging another switch between the $V_{S1}$ source and the input terminal a.

Figure 4:
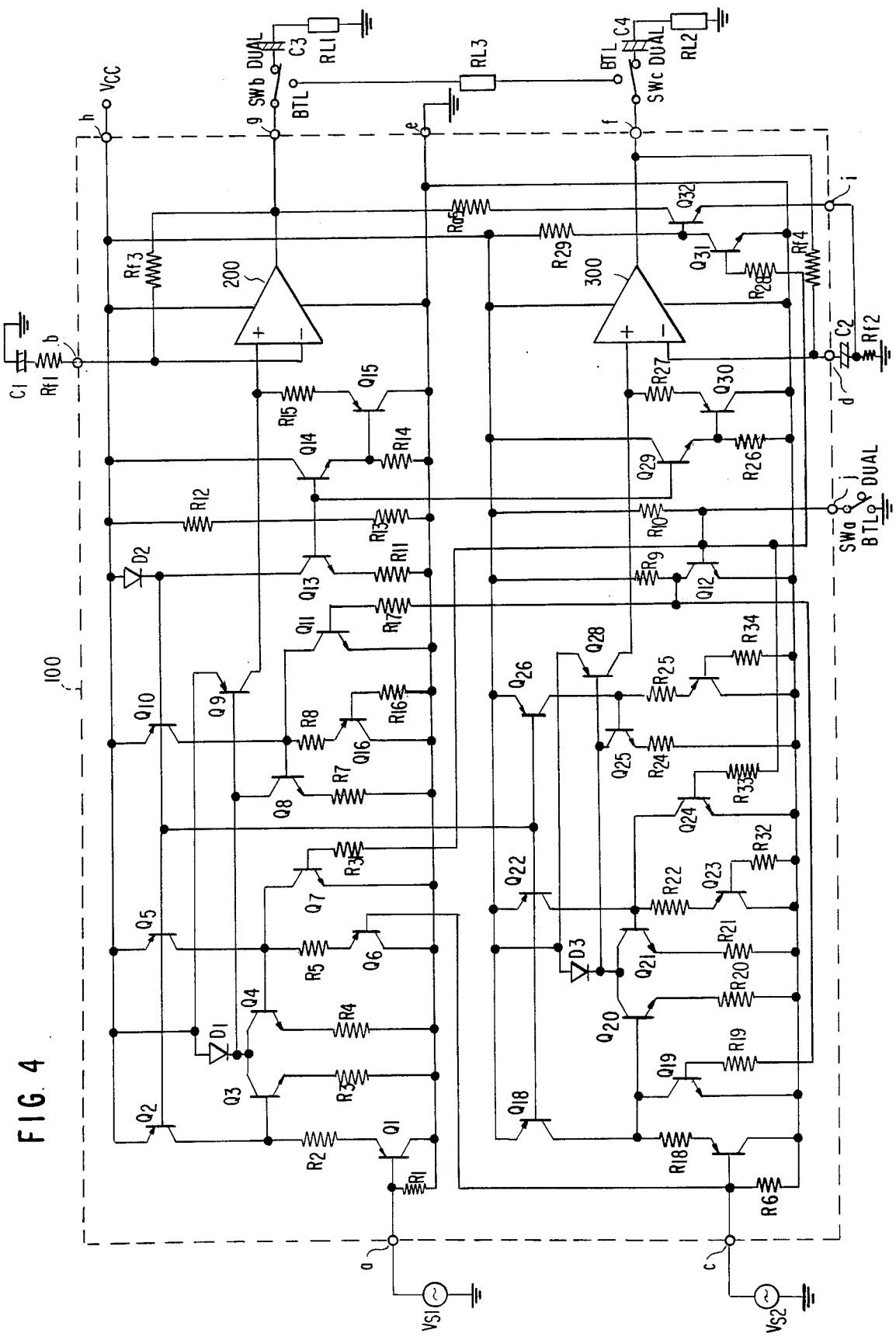
FIG. 4 is a circuit diagram of the preferred embodiment of the present invention.

The circuit arrangement of this embodiment shown in FIG. 4 is designed to avoid switching noise accompanying the switching between the dual-channel amplifier operation and the BTL amplifier operation. This noise is caused by a change in the bias current of the signal path. Therefore, the bias current of the signal path is arranged to be constant in spite of the switching. When the system operates as a dual-channel amplifier, because the switch transistor $Q_7$ is ON to render the transistor $Q_4$ OFF, the current from the diode $D_1$ flows through the transistors $Q_3$ and $Q_8$. On the contrary, when the system operates as a BTL amplifier, the switch transistor $Q_{11}$ is ON to render the transistor $Q_8$ OFF, so that the current from the diode $D_1$ flows through the transistors $Q_3$ and $Q_4$. Thus, in spite of the switching, the current from the diode $D_1$ will always have the same value. In the same manner, the current from the diode $D_3$ flows through the transistors $Q_{20}$ and $Q_{25}$ in the dual-channel amplifier operation and through the transistors $Q_{21}$ and $Q_{25}$ in the BTL amplifier operation. This current is also constant in spite of the switching. Thus, the currents flowing through the diodes $D_1$ and $D_3$ are constant in the dual-channel amplifier operation and the BTL amplifier operation, and therefore, the bias potentials at the non-inverting inputs of the amplifying circuits 200 and 300 are also constant in the both amplifier operation. As a result, the switching noise which may occur upon switching is avoided.

This will be explained in more detail in the following. First, in a case where the switch SWa is in its "Dual" position, the current from the diode $D_1$ flows through the transistors $Q_3$ and $Q_8$. Accordingly, the bias potential $V_{BI1}$ at the non-inverting input of the amplifying circuit 200 is expressed by the following equations:

$$B_{BI1} = I_{CQ9} \times R_{15} + V_{BEQ15} + V_{BQ15}$$
$$= I_{D1} \times R_{15} + V_{BEQ15} + V_{BQ15} \qquad (1);$$

$$I_{D1} = I_{CQ3} + I_{CQ8} \qquad (2)$$

$$I_{CQ3} = (V_{BQ3} - V_{BEQ3})/R_3 \qquad (3);$$

$$I_{CQ8} = (V_{BQ8} - V_{BEQ8})/R_7 \qquad (4);$$

and $$V_{BQ8} = I_{CQ10} \times R_8 + V_{BQ16} + V_{BEQ16} \qquad (5);$$

wherein:
$I_{D1}$: current of diode $D_1$;
$I_{CQ3}$, $I_{CQ8}$, $I_{CQ9}$ and $I_{CQ10}$: collector currents of transistors $Q_3$, $Q_8$, $Q_9$ and $Q_{10}$;
$V_{BEQ3}$, $V_{BEQ8}$ and $V_{BEQ15}$: voltages between bases and emitters of transistors $Q_3$, $Q_8$ and $Q_{15}$: and
$V_{BQ3}$, $V_{BQ8}$, $V_{BQ15}$ and $V_{BQ16}$: base potentials of transistors $Q_3$, $Q_8$, $Q_{15}$ and $Q_{16}$.

In the other case where the switch SWa is in its "BTL" position, the bias potential $V_{BI2}$ at the non-inverting input terminal is expressed by the following equations:

$$V_{BI2} = I_{D1} \times R_{15} + V_{BEQ15} + V_{BQ15} \qquad (6);$$

$$I_{D1} = I_{CQ3} + I_{CQ4} \qquad (7);$$

$$I_{CQ4} = (V_{BQ4} - V_{BEQ4})/R_4 \qquad (8);$$

and $$V_{BQ4} = I_{CQ5} \times R_5 + V_{BQ6} + V_{BEQ6} \qquad (9);$$

wherein:
$I_{CQ4}$ and $I_{CQ5}$: collector currents of transistors $Q_4$ and $Q_5$;
$V_{BEQ4}$: voltage between base and emitter of transistor $Q_4$; and
$V_{BQ4}$ and $V_{BQ6}$: base potentials of transistors.

In the equations (5) and (9), $I_{CQ5} = I_{CQ10}$ because the transistors $Q_5$ and $Q_{10}$ are of identical shape and, together with the diode $D_2$, constitute current mirror circuits, and $V_{BQ16} = V_{BQ6}$ because the transistors $Q_6$ and $Q_{16}$ are of identical shape and because the resistors $R_6$ and $R_{16}$ have equal values. Since the resistors $R_5$ and $R_8$ have equal values, $V_{BQ8} = V_{BQ4}$. In the equations (4) and (8), $V_{BEQ4} = V_{BEQ8}$ and $R_4 = R_7$, because the transistors $Q_4$ and $Q_8$ are of identical shape and because the resistors $R_4$ and $R_7$ are designed to have equal values. Consequently, $I_{CQ4} = I_{CQ8}$. In the equations (1) and (6), therefore, $V_{BI1}=V_{BI2}$ so that the bias potentials at the non-inverting input terminal of the amplifying circuit 200 are equal, notwithstanding whether the switch SWa is in the "Dual" or "BTL" position, thus avoiding any fluctuation due to the interchange between those two states. As a result, no switching noise is generated by that interchange.

With respect to the bias potentials at the non-inverting input of the amplifying circuit 300 in the both amplifier operation, they are also constant. The bias potential at the non-inverting input of the amplifying circuit 300 is determined by the base potential $V_{BQ30}$ of a transistor $Q_{30}$, the base-emitter voltage $V_{BEQ30}$ of the transistor $Q_{30}$, and the voltage drop $(R_{27} \times I_{CQ28})$ of the resistor $R_{27}$. Here, since the transistor $Q_{28}$ and the diode $D_3$ constitute a current mirror circuit, the collector current $I_{CQ28}$ of the transistor $Q_{28}$ becomes equal to the current $I_{D3}$ of the diode $D_3$. Consequently the current $I_{D3}$ of the diode $D_3$ is determined by the respective collector currents $I_{CQ20}$, $I_{CQ21}$ and $I_{CQ25}$ of the transistors $Q_{20}$, $Q_{22}$ and $Q_{25}$. In case the switch SWa is in its Dual position, more specifically, the transistors $Q_{17}$ and $Q_{20}$ are in their conducting states whereas the transistors $Q_{21}$ and $Q_{23}$ are in their non-conducting states so that $I_{D3}=I_{CQ20}+I_{CQ25}$. When the switch SWa is in its BTL position, the transistors $Q_{17}$ and $Q_{20}$ are in their non-conducting states whereas the transistors $Q_{21}$ and $Q_{23}$ are in their conducting states, so that $I_{D3}=I_{CQ21}+I_{CQ25}$. Similar to the upper part of the embodiment of FIG. 4, the respective collector currents $I_{CQ20}$ and $I_{CQ21}$ are designed to be equal by employing the identical transistor pairs of transistors $Q_{17}$ and $Q_{23}$ and transistors $Q_{20}$ and $Q_{21}$, and identical resistor pairs of resistors $R_6$ and $R_{32}$, resistors $R_{18}$ and $R_{22}$ and resistors $R_{20}$ and $R_{21}$. The transistors $Q_{20}$ and $Q_{21}$ are alternately rendered conductive. Therefore, the current $I_{D3}$ does not fluctuate when the switch SWa is turned. As a result, because the bias potential at the non-inverting input of the amplifying circuit 300 never changes, no switching noise is generated by switching the switch SWa.

Figure 5:
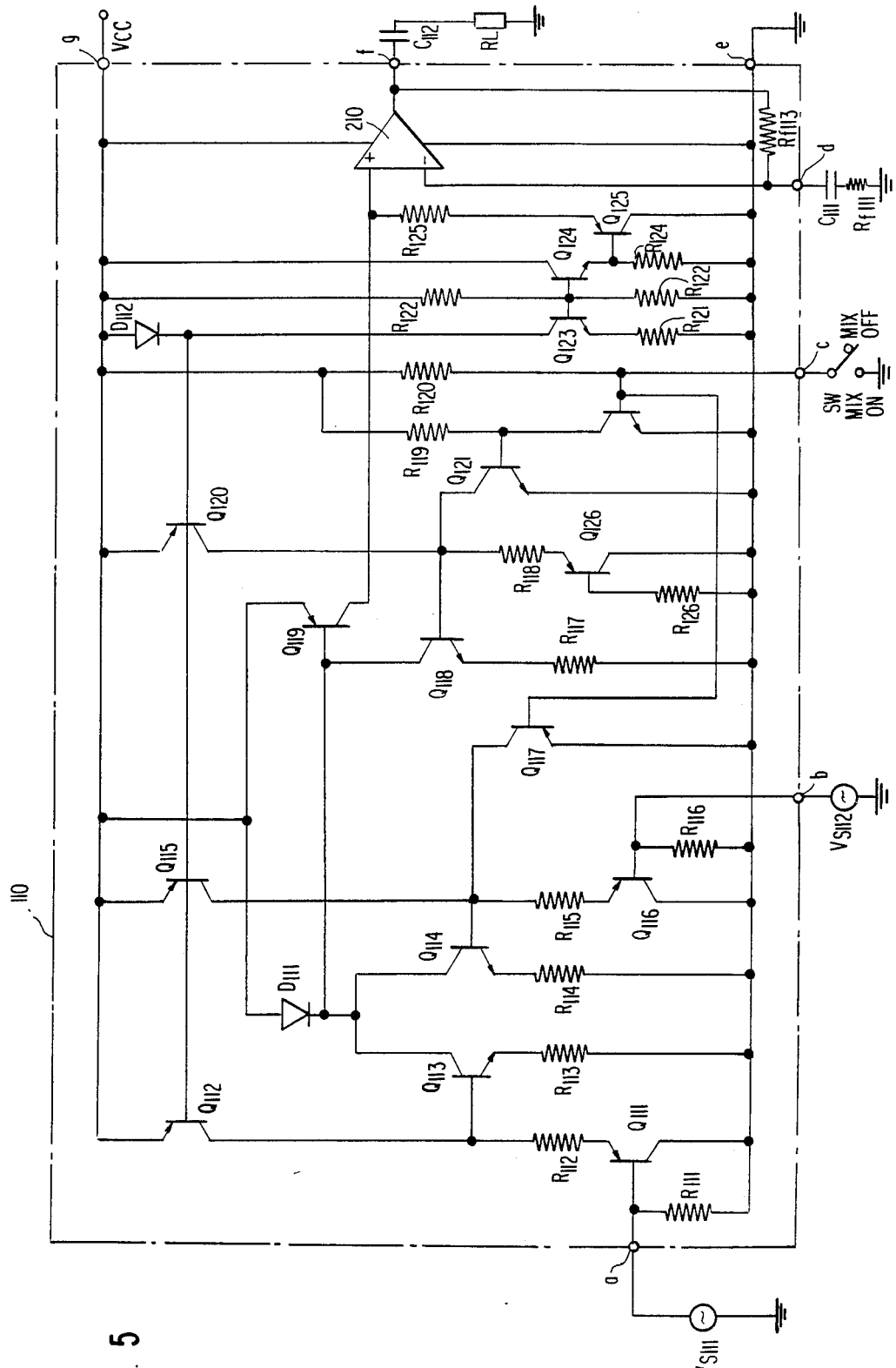
FIG. 5 is a circuit diagram of a second preferred embodiment of the present invention.

FIG. 5 shows a second preferred embodiment of the present invention. The amplifier of this embodiment shown as a monolithic integrated circuit 110, has one amplifying circuit 210, but has two input terminals a and b which are supplied with first and second input signals $V_{S111}$ and $V_{S112}$, respectively. The amplifying circuit 210 includes non-inverting and inverting inputs, and an output connected to an output terminal f. A first feedback resistor $R_{f113}$ is connected between the inverting input and the output of the amplifying circuit 200. The inverting input is connected to a terminal d which is grounded through a capacitor $C_{111}$ and a second feedback resistor $R_{f111}$. As the input signal $V_{S111}$, an audio signal from a tape recorder or a record player may be supplied to the terminal a, and a voice signal from a microphone may be applied to the terminal b as the second input signal $V_{S112}$. A switch SW connected to a terminal c is provided for switching the amplifying operation of the amplifier 110 shown in FIG. 5. When the switch SW is in its "MIX OFF" position, the amplifier 110 receives only the first input signal $V_{S111}$, and supplies its amplified signal to a load $R_L$ through the output terminal f and a capacitor $C_{112}$. When the switch SW is in its "MIX ON" position, the amplifier 110 receives the first and second input signals $V_{S111}$ and $V_{S112}$, mixes them, and supplies an amplified signal of the mixed signal to the load $R_L$. Thus, the amplifier shown in FIG. 5 generates two types of output signal by the switching between "MIX OFF" and "MIX ON" positions in the switch SW.

At this time, if a bias potential at the non-inverting input of the amplifying circuit 210 is changed by the switching operation of the switch SW, the switching noise is supplied to the load $R_L$. However, the amplifier 110 shown in FIG. 5 has such a circuit arrangement that the switching noise can be avoided.

In FIG. 5, a bias current is set by means of a transistor $Q_{123}$ and resistors $R_{121}$, $R_{122}$ and $R_{123}$, and supplied to the respective circuit portions through a current mirror circuit composed of a diode $D_{112}$ and transistors $Q_{112}$, $Q_{115}$ and $Q_{120}$. An emitter follower circuit constructed of a transistor $Q_{111}$ and a resistor $R_{112}$ and a constant current circuit constructed of a transistor $Q_{113}$ and a resistor $R_{113}$ are biased by the transistor $Q_{112}$. Likewise, an emitter follower circuit constructed of a transistor $Q_{116}$ and a resistor $R_{115}$, and a constant current circuit constructed of a transistor $Q_{114}$ and a resistor $R_{114}$ are biased by the transistor $Q_{115}$. Moreover, constant current circuits constructed of a transistor $Q_{126}$ and a resistor $R_{118}$, and a transistor $Q_{118}$ and a resistor $R_{117}$ are biased by the transistor $Q_{120}$.

A switching circuit is constructed of resistors $R_{119}$ and $R_{120}$ and transistors $Q_{117}$, $Q_{121}$ and $Q_{122}$. When the switch SW is in its "MIX OFF" position, the transistors $Q_{117}$ and $Q_{122}$ are biased by the resistor $R_{120}$ into conducting states whereas the transistor $Q_{121}$ is biased into its non-conducting state. As a result, the collector of the transistor $Q_{115}$ is grounded to render the transistors $Q_{114}$ and $Q_{116}$ non-conducting but the transistors $Q_{118}$ and the transistor $Q_{126}$ conducting. When the switch SW is in its "MIX ON" position, on the contrary, the transistors $Q_{117}$ and $Q_{122}$ have their bases grounded and rendered non-conducting, whereas the transistor $Q_{121}$ is biased by the resistor $R_{119}$ into its conducting state. As a result, the transistors $Q_{114}$ and $Q_{116}$ are rendered conducting whereas the transistors $Q_{115}$ and $Q_{126}$ are rendered non-conducting with a result that the collector of the transistor $Q_{10}$ is grounded.

A transmission circuit is constructed of a current mirror circuit having a diode $D_{111}$ and a transistor $Q_{119}$. The diode $D_{111}$ has its cathode connected to the collectors of the transistors $Q_{113}$, $Q_{114}$ and $Q_{118}$. The transistor $Q_{119}$ has its collector connected to both a resistor $R_{125}$ and the non-inverting input of the amplifying circuit 210. Moreover, the transistor $Q_{119}$ supplies a bias current to the resistor $R_{125}$ and a transistor $Q_{125}$ so that the bias potential at the non-inverting input of the amplifying circuit 210 is set by the transistors $Q_{124}$ and $Q_{125}$ and the resistors $R_{122}$, $R_{123}$, $R_{124}$ and $R_{125}$.

The operations of the circuit having the construction thus far described will be described in the following.

First of all, when the switch SW connected to the switching terminal c is in its "MIX OFF" position, the signal of the first signal source $V_{S111}$, which is applied to the input terminal a, is transmitted through the transistor $Q_{111}$, the resistor $R_{112}$ and the transistor $Q_{113}$ to the diode $D_{111}$. The signal of the second signal source $V_{S112}$ which is applied to the input terminal b, is not transmitted to the diode $D_{111}$ because the transistors $Q_{116}$ and $Q_{114}$ are in their non-conducting states by the conducting state of the transistor $Q_{117}$. As a result, only the first signal is further transmitted by the current mirror circuit, which is constructed of the diode $D_{111}$ and the transistor $Q_{119}$, to the non-inverting input of the amplifying circuit 210.

When the switch SW is in its "MIX ON" position, on the contrary, the signal of the first signal source $V_{S111}$ is transmitted to the diode $D_{111}$ in a similar manner to the aforementioned case. The signal of the second signal source $V_{S112}$ is also transmitted to the diode $D_{111}$ because the transistors $Q_{116}$ and $Q_{114}$ are in their conducting states. As a result, the first and second signals $V_{S111}$ and $V_{S112}$ transmitted to the diode $D_{111}$ are mixed, and the mixed signal is transmitted by the current mirror circuit constructed of the diode $D_{111}$ and the transistor $Q_{119}$ to the amplifying circuit 210.

The bias potentials at the non-inverting input of the amplifying circuit 210 in the two states, i.e., in the MIX OFF and MIX ON states will be described in the following.

The bias potential at the non-inverting input of the amplifying circuit 210 is determined by the base potential $V_{BQ125}$ of the transistor $Q_{125}$, the base-emitter voltage $V_{BEQ125}$ of the transistor $Q_{125}$, and the voltage drop ($R_{125} \times I_{CQ119}$) across the resistor $R_{125}$. The current $I_{CQ119}$ represents the collector current of the transistor $Q_{119}$. Since the transistor $Q_{119}$ and the diode $D_{111}$ constitute a current mirror circuit, the current $I_{CQ119}$ is equal to the current $I_{D111}$ flowing through the diode $D_{111}$. The current $I_{D111}$ is determined by the collector currents $I_{CQ113}$, $I_{CQ114}$ and $I_{CQ118}$ of the transistors $Q_{113}$, $Q_{114}$ and $Q_{118}$. In the case where the switch SW is in its "MIX OFF" position, the transistors $Q_{113}$ and $Q_{118}$ are in the conducting state, whereas the transistor $Q_{114}$ is in non-conducting state. Therefore, the current $I_{D111}$ is equal to the sum of the collector currents $I_{CQ113}$ and $I_{CQ118}$ ($I_{D111} = I_{CQ113} + I_{CQ118}$). When the switch SW is in "MIX ON" position, the transistors $Q_{113}$ and $Q_{114}$ are in the conducting state, whereas the transistor $Q_{118}$ is in the non-conducting state. Accordingly, the current $I_{D111}$ is equal to the sum of the collector currents $I_{CQ113}$ and $I_{CQ114}$ ($I_{D111} = I_{CQ113} + I_{CQ114}$). The collector currents $I_{CQ114}$ and $I_{CQ118}$ are designed to be equal by employing the identical transistor pairs of transistors $Q_{114}$ and $Q_{118}$ and transistors $Q_{116}$ and $Q_{126}$, and identical resistor pairs of resistors $R_{114}$ and $R_{117}$, resistors $R_{115}$ and $R_{118}$ and resistors $R_{116}$ and $R_{126}$. Consequently, the current $I_{D111}$ does not fluctuate when the switch SW is turned. Therefore, the bias potential at the non-inverting input of the amplifying circuit 210 does not change, so that no switching noise is generated.

As has been described hereinbefore, according to the present invention, it is possible to provide a power amplifier which can easily switch its function to generate two types of an output signal. The amplifier is also advantageous in that it is suitable for formation in a semiconductor integrated circuit and that there is no switching noise during its switchover between functions.

What is claimed is:

1. An amplifier comprising an input terminal receiving an input signal, an input curcuit (e.g. $Q_1$, $R_1$, $Q_2$, $R_2$) producing a first current which has a value corresponding to the sum of a first bias current and an information current corresponding to said input signal, a first circuit (e.g. $Q_5$, $R_5$, $Q_6$, $R_6$) producing a second current including a second bias current when enabled, a second circuit (e.g. $Q_{10}$, $R_8$, $Q_{16}$, $R_{16}$) producing a third current including a third bias current when enabled, at least said second and third bias currents being equal, means for alternately enabling one of said first and second circuits, a current adder for producing an added current corresponding to the sum of said first current and the current from the enabled one of said second and third circuits, an amplifying portion for amplifying said added current and an output terminal for producing an output from said amplifying portion.

2. An amplifier as claimed in claim 1, wherein said second current includes another information current corresponding to another input signal in addition to said second bias current.

3. An amplifier as claimed in claim 1, wherein said said first bias current also equals said second bias current.

4. An amplifier comprising a first terminal supplied with a first input signal, a first input circuit coupled to said first terminal and generating a first output current corresponding to said first input signal, a second terminal supplied with a second input signal, a second input circuit coupled to said second terminal and generating a second output current comprising a first current component which corresponds to said second input signal and a d.c. bias current of said second input circuit, a current circuit generating a third output current substantially equal to said d.c. bias current, a transmission circuit generating a fourth output current corresponding to the sum of said first and second output currents or the sum of said first and third output currents, and an amplifying circuit receiving a voltage obtained by use of said fourth output current.

* * * * *